US012581961B2

(12) United States Patent
Min et al.

(10) Patent No.: US 12,581,961 B2
(45) Date of Patent: Mar. 17, 2026

(54) SUBSTRATE HAVING A DIE POSITION MARK AND A SEMICONDUCTOR DIE STACK STRUCTURE INCLUDING SEMICONDUCTOR DIES STACKED ON THE SUBSTRATE

(71) Applicant: SK hynix Inc., Icheon-si (KR)

(72) Inventors: Bok Gyu Min, Icheon-si (KR); Beom Sang Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 394 days.

(21) Appl. No.: 18/184,559

(22) Filed: Mar. 15, 2023

(65) Prior Publication Data

US 2024/0120285 A1 Apr. 11, 2024

(30) Foreign Application Priority Data

Oct. 7, 2022 (KR) ........................ 10-2022-0128507

(51) Int. Cl.
H01L 23/544 (2006.01)
H01L 25/065 (2023.01)

(52) U.S. Cl.
CPC ........ H01L 23/544 (2013.01); H01L 25/0657 (2013.01); *H01L 2223/54426* (2013.01); *H01L 2223/5448* (2013.01); *H01L 2225/06506* (2013.01); *H01L 2225/0651* (2013.01); *H01L 2225/06562* (2013.01)

(58) Field of Classification Search
CPC ........... H01L 23/544; H01L 2223/5448; H01L 2223/54426; H01L 25/0657; H01L 2225/06562
See application file for complete search history.

(56) References Cited

U.S. PATENT DOCUMENTS

| | | | | |
|---|---|---|---|---|
| 2015/0056726 A1* | 2/2015 | Foong | .................... | H01L 24/85 |
| | | | | 438/15 |
| 2016/0247790 A1* | 8/2016 | Huang | .................... | H01L 25/50 |
| 2021/0242178 A1* | 8/2021 | Chang | .............. | H01L 23/49833 |
| 2022/0037265 A1* | 2/2022 | Min | ........................ | H01L 24/83 |
| 2022/0115355 A1* | 4/2022 | Kim | .................... | H01L 25/0657 |
| 2023/0118535 A1* | 4/2023 | Kim | ................. | H01L 21/76898 |
| | | | | 257/668 |

FOREIGN PATENT DOCUMENTS

| | | | |
|---|---|---|---|
| CN | 105182681 B | * | 7/2019 |
| KR | 1020130102948 A | | 9/2013 |

* cited by examiner

*Primary Examiner* — Joseph C. Nicely
(74) *Attorney, Agent, or Firm* — WILLIAM PARK AND ASSOCIATES LTD.

(57) ABSTRACT

A substrate includes: a first die alignment mark and a first die position mark defining a die stack region. The first die alignment mark has substantially a cross shape having substantially a vertical bar and substantially a horizontal bar intersecting each other substantially perpendicularly, and the first die position mark includes a first main position mark having a first area and a first branch position mark having a second area different from the first area.

20 Claims, 15 Drawing Sheets

SUBSTRATE HAVING A DIE POSITION MARK AND A SEMICONDUCTOR DIE STACK STRUCTURE INCLUDING SEMICONDUCTOR DIES STACKED ON THE SUBSTRATE

CROSS-REFERENCE TO RELATED APPLICATIONS

The present application claims priority to Korean Patent Application No. 10-2022-0128507, filed on Oct. 7, 2022, in the Korean Intellectual Property Office, which is incorporated herein by reference in its entirety.

BACKGROUND

1. Technical Field

Various embodiments of the present disclosure generally provide a substrate, and more particularly, a substrate and a semiconductor die stack structure including semiconductor dies stacked over the substrate.

2. Related Art

A die stack package might include a plurality of semiconductor dies.

SUMMARY

In accordance with an embodiment of the present disclosure, a substrate may include: a first die alignment mark and a first die position mark defining a die stack region. The first die alignment mark may have substantially a cross shape having substantially a vertical bar and substantially a horizontal bar intersecting each other substantially perpendicularly. The first die position mark may include a first main position mark having a first area and a first branch position mark having a second area different from the first area.

In accordance with an embodiment of the present disclosure, a substrate may include: a die stack region; a first die alignment mark positioned to be aligned with a bottom left corner of the die stack region; a second die alignment mark positioned to be aligned with a top right corner of the die stack region; and a first die position mark positioned to be aligned with a top left corner of the die stack region. The first die alignment mark and the second die alignment mark may have substantially a cross shape having substantially a vertical bar and substantially a horizontal bar that substantially perpendicularly intersect each other. The first die position mark may include substantially a square shape, the first main position mark comprising a first area and a first branch position mark having substantially a bar shape, the first branch position mark comprising a second area less than the first area.

In accordance with an embodiment of the present disclosure, a semiconductor die stack structure may include: a semiconductor die stacked over a substrate, where the semiconductor die has first to fourth corners, and the first corner and the second corner are opposite to each other in a first diagonal direction, and the third corner and the fourth corner are opposite to each other in a second diagonal direction, and the first diagonal direction and the second diagonal direction intersect each other; a first die alignment mark positioned over the substrate to be aligned with the first corner of the semiconductor die; and a first die position mark positioned over the substrate to be aligned with the third corner of the semiconductor die. The first die alignment mark has substantially a cross shape having substantially a bar-shaped vertical bar extending in substantially a vertical direction and substantially a bar-shaped horizontal bar extending in substantially a horizontal direction which is substantially perpendicular to the vertical direction. The first die position mark may include: a first main position mark having substantially a square shape and a first branch position mark having substantially a bar shape.

DETAILED DESCRIPTION

Figure 1:
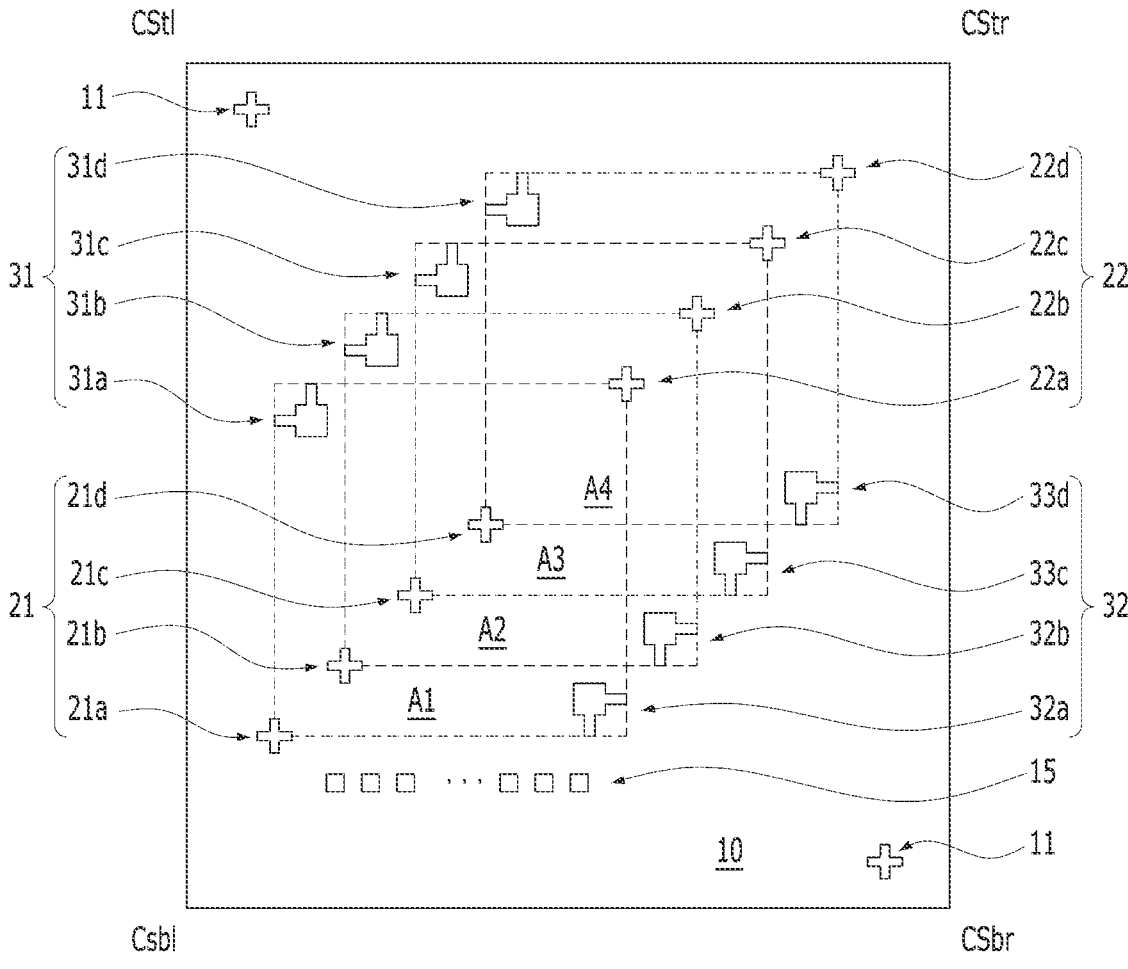
FIG. 1 is a top view illustrating a substrate in accordance with an embodiment of the present disclosure.
Figure 1:
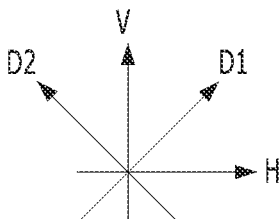

Various embodiments of the present disclosure will be described below in more detail with reference to the accompanying drawings. The embodiments may, however, be embodied in different forms and should not be construed as limited to the embodiments set forth herein. Throughout the disclosure, like reference numerals refer to like parts throughout the various figures and embodiments.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. It will be understood that, although the terms first, second, third etc. may be used herein to describe various elements, directions, components, regions, layers and/or sections, these elements, directions, components, regions, layers and/or sections should not be limited by these terms. These terms are only used to distinguish one element, direction, component, region, layer or section from another region, layer, or section. These terms are only used to distinguish one element, direction, component, region, layer or section from another element, direction, component, region, layer, or section but not used to define only the element, direction, component, region, layer or section itself or to mean a particular sequence. Thus, a first element, direction, component, region, layer, or section discussed below could be termed a second element, direction, component, region, layer, or section without departing from the teachings of the present disclosure.

Embodiments of the present disclosure may be directed to a substrate having die position marks, a semiconductor die stack structure including a plurality of semiconductor dies stacked over the substrate, and a semiconductor package having the semiconductor die stack structure.

Figure 2:
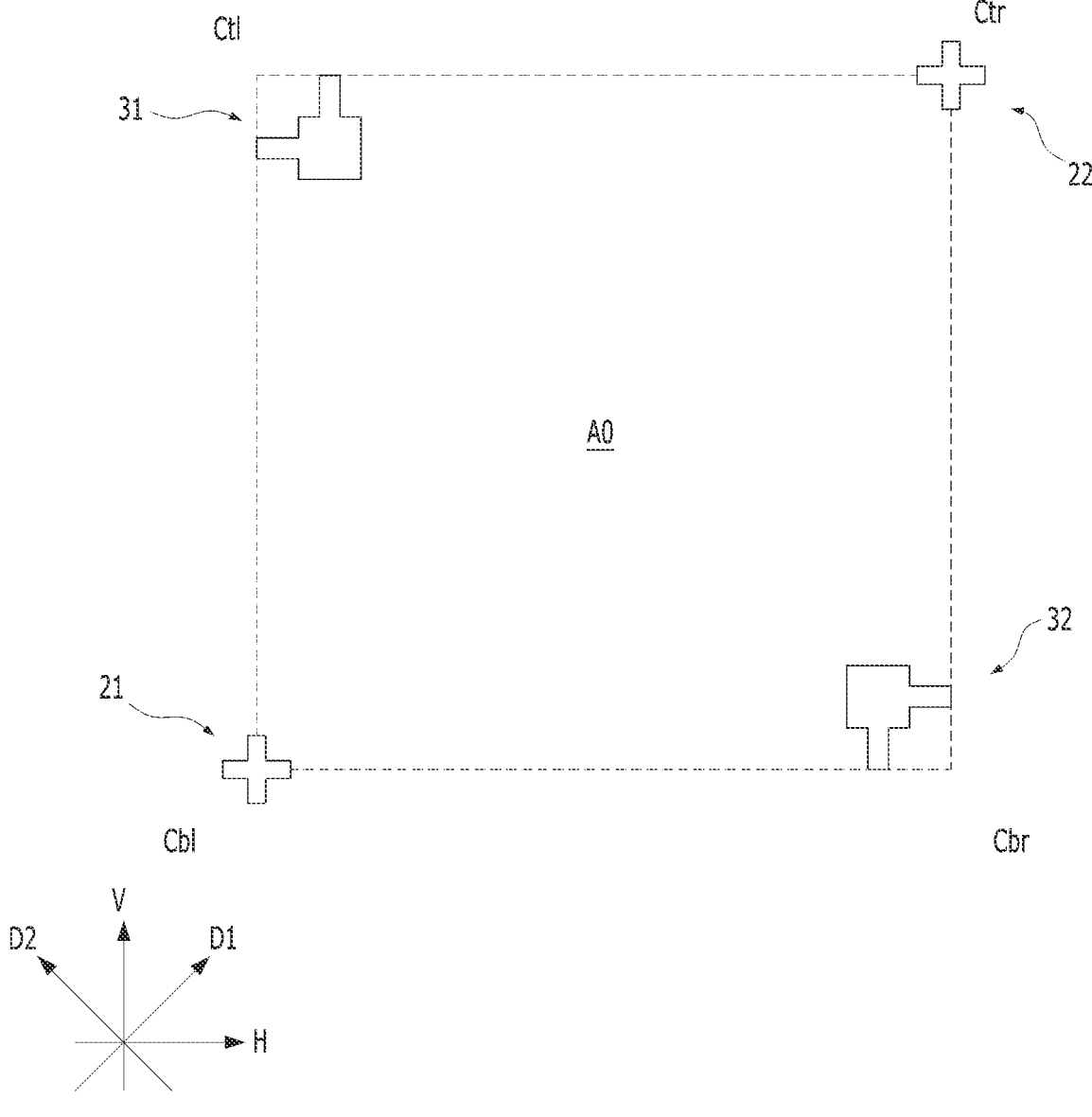
FIG. 2 is a top view illustrating any one die stack region among the die stack regions shown in FIG. 1, any one first die alignment mark among first die alignment marks, any one second die alignment mark among second die alignment marks, any one first die position mark among first die position marks, and any one second die position among second die position marks.

FIG. 1 is a top view illustrating a substrate 10 in accordance with an embodiment of the present disclosure. FIG. 2 is a top view illustrating any one die stack region A0 among the die stack regions A1 to A4 shown in FIG. 1, any one first die alignment mark 21 among first die alignment marks 21a to 21d, any one second die alignment mark 22 among second die alignment marks 22a to 22d, and one first die position mark 31 among first die position marks 31a to 31d, and any one second die position mark 32 among second die position marks 32a to 32d.

Referring to FIGS. 1 and 2, a substrate 10 according to an embodiment of the present disclosure may include substrate alignment marks 11, first die alignment marks 21, second die alignment marks 22, first die position marks 31, second die position marks 32, and die stack regions A0 to A4. The alignment marks 11, the first die alignment marks 21, the second die alignment marks 22, the first die position marks 31, and the second die position marks 32 may be disposed in each of the die stack regions A0 to A4. Each of the die stack regions (A0 to A4) may have, for example but not limited to, a square shape. The die stack regions A0 to A4 may be virtually defined by the first and second die alignment marks 21 and 22 and/or the first and second die position marks 31 and 32. According to the embodiment of the present disclosure, the substrate 10 having four die stack regions A1 to A4 are described. However, the substrate 10 can have at least two or more die stack regions A0 to A4. In other words, at least two semiconductor dies may be stacked over the substrate 10.

The substrate 10 may include a printed circuit board (PCB). In other embodiments, the substrate 10 may include, for example but not limited to, a carrier substrate, a glass substrate, a sapphire substrate, a silicon wafer, a metal plate, a ceramic substrate, or a redistribution layer.

The substrate alignment marks 11 may be positioned on at least two corners among the four corners i.e., a top-left substrate corner CStl, a top-right substrate corner CStr, a bottom-left substrate corner CSbl, and a bottom-right substrate corner CSbr of the substrate 10. For example, in the embodiments, it is illustrated that the substrate alignment marks 11 are positioned at the top-left substrate corner CStl and the bottom-right substrate corner CSbr of the substrate 10 among the four substrate corners CStl, CStr, CSbl, and CSbr. For example, at least two among the substrate alignment marks 11 may be positioned at the top-left substrate corner CStl and the bottom-right substrate corner CSbr that are opposite to each other in a second diagonal direction D2. The substrate alignment marks 11 may have a cross shape, a right-angle elbow shape, a T-shape, a square shape, or various other shapes. According to an embodiment of the present disclosure, the substrate alignment marks 11 may have the cross shape. In an embodiment, the substrate alignment marks 11 may have the cross shape as shown in FIG. 1.

The first die alignment marks 21 may be positioned over the substrate 10 to be aligned with a first corner, i.e., bottom-left corners Cbl of the die stack regions A0 to A4. The second die alignment marks 22 may be positioned over the substrate 10 to be aligned with a second corner, i.e., top-right corners Ctr of the die stack regions A0 to A4. In other words, the first die alignment marks 21 and the second die alignment marks 22 may be respectively positioned over the substrate 10 to be aligned with a bottom-left corner Cbl and a top-right corner Ctr that are opposite to each other in a first diagonal direction D1. The first diagonal direction D1 and the second diagonal direction D2 may intersect each other. According to an embodiment of the present disclosure, the first die alignment marks 21 may be positioned to be aligned adjacent to the bottom left corners Cbl of the die stack regions A0 to A4, and the second die alignment marks 22 may be positioned to be aligned adjacent to the top right corners Ctr of the die stack regions A0 to A4. The first and second die alignment marks 21 and 22 will be described later in detail by referring to FIG. 3.

The first die position marks 31 may be positioned over the substrate 10 to be aligned with a third corner, i.e., the top-left corners Ctl of the die stack regions A0 to A4. The second die position marks 32 may be positioned over the substrate 10 to be aligned with a fourth corner, i.e., the bottom-right corners Cbr of the die stack regions A0 to A4. For example, the first die position marks 31 may be positioned to be aligned with the third corner (e.g., the top-left corner Ctl) that are aligned in a vertical direction V with the first corner (e.g., the bottom-left corner Cbl) where the first die alignment marks 21 are positioned, and aligned in a horizontal direction H with the second corner (e.g., the top-right corner Ctr) where the second die alignment marks 22 are positioned. The second die position marks 32 may be positioned to be aligned with the fourth corner (e.g., the bottom-right corner Cbr) that are aligned in the horizontal direction H with the first corner (e.g., the bottom-left corner Cbl) where the first die alignment marks 21 are positioned, and aligned in the vertical direction V with the second corner (i.e., the top-right corner Ctr) where the second die alignment marks 22 are positioned. That is, the first die position marks 31 and the second die position marks 32 may be respectively positioned to be aligned with the opposite corners (e.g., the top-left corner Ctl and the bottom-right corner Cbr). According to the embodiment of the present disclosure, the first die position marks 31 may be positioned to be aligned adjacent to the top-left corners Ctl of the die stack regions A0 to A4, and the second die position marks 32 may be positioned to be aligned adjacent to the bottom-right corners Cbr of the die stack regions A0 to A4. The first and second die position marks 31 and 32 will be described later in detail by referring to FIGS. 4A and 4B.

Since a plurality of semiconductor dies may be stacked over the substrate 10, a plurality of die stack regions A0 to A4 may be defined over the substrate 10. Thus, a plurality of first and second die alignment marks 21 and 22 and a plurality of first and second die position marks 31 and 32 may be positioned to overlap and be aligned with each other in the die stack regions A0 to A4 over the substrate 10, respectively.

According to an embodiment of the present disclosure, a plurality of semiconductor dies may be stacked over the substrate 10 in a predetermined direction, for example, the first diagonal direction D1. The die stack regions A1 to A4 may be arranged in the first diagonal direction D1 to be offset in the horizontal direction H and the vertical direction V, respectively. Accordingly, the first die alignment marks 21, the second die alignment marks 22, the first die position marks 31, and the second die position marks 32 may also be arranged in the first diagonal direction D1, respectively. The word "predetermined" as used herein with respect to a parameter, such as a predetermined direction, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Substrate pads 15 may be disposed over the substrate 10. The substrate pads 15 may be arranged in the horizontal direction H. The substrate pads 15 may include a conductor, such as, but not limited to, copper (Cu).

Figure 3:
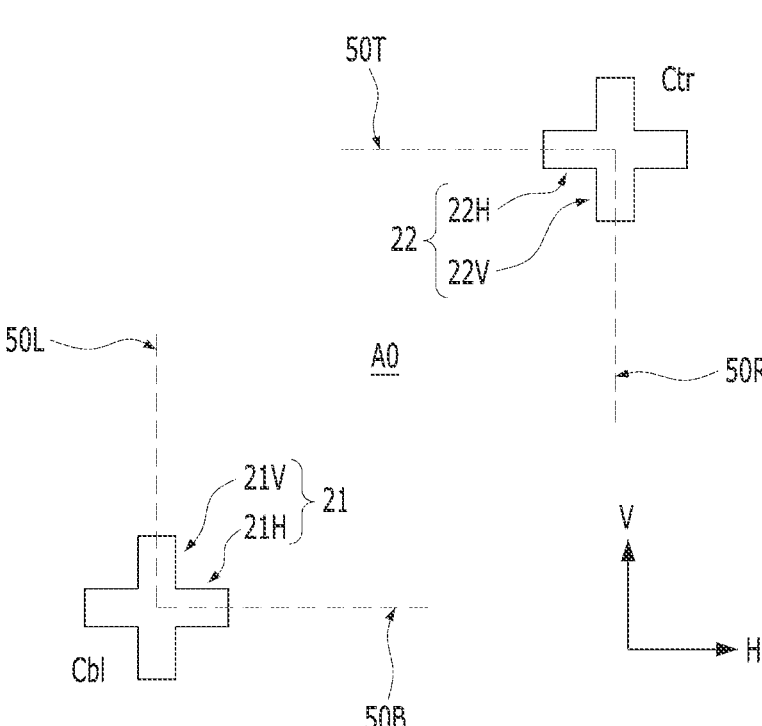
FIG. 3 is a top view illustrating the die stack regions and the first and second die alignment marks which may be aligned.

FIG. 3 is a top view illustrating any one die stack region A0 and the first and second die alignment marks 21 and 22 which may be accurately aligned. Referring to FIG. 3, the first and second die alignment marks 21 and 22 may have the cross shape. For example, each of the first and second die alignment marks 21 and 22 may include horizontal bars 21H and 22H which each are extending in the horizontal direction H and vertical bars 21V and 22V which each are extending in the vertical direction V. Respectively, the horizontal bars 21H and 22H and the vertical bars 21V and 22V may intersect each other perpendicularly. In other words, the first and second die alignment marks 21 and 22 may have center points at which the horizontal bars 21H and 22H and the vertical bars 21V and 22V intersect each other, respectively. The die alignment marks 21 and 22 may be aligned in such a manner that a vertex of the bottom-left corner Cbl of the die stack region A0 is aligned and overlapped with the center point of the first die alignment mark 21, and a vertex of the top-right corner Ctr of the die stack region A0 is aligned and overlapped with the center point of the second die alignment mark 22. For example, the left side 50L of the die stack region A0 may be aligned and overlapped with the vertical bar 21V of the first die alignment mark 21, and the bottom side 50B of the die stack region A0 may be aligned with the horizontal bar 21H of the die alignment mark 21, and the right side 50R of the die stack region A0 may be aligned and overlapped with the vertical bar 22V of the second die alignment mark 22, and the top side 50T of the die stack region A0 may be aligned and overlapped with the horizontal bar 22H of the second die alignment mark 22.

Figure 4A:
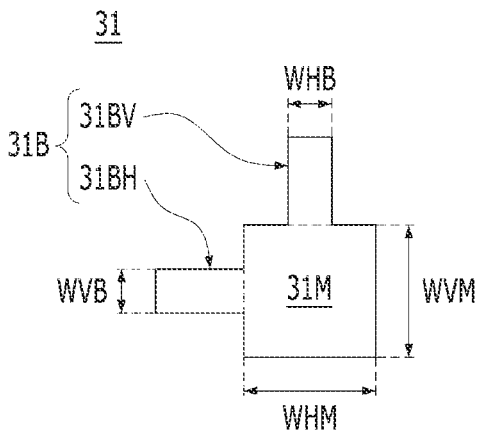
FIG. 4A is an enlarged top view illustrating the first and second die position marks.
Figure 4A:
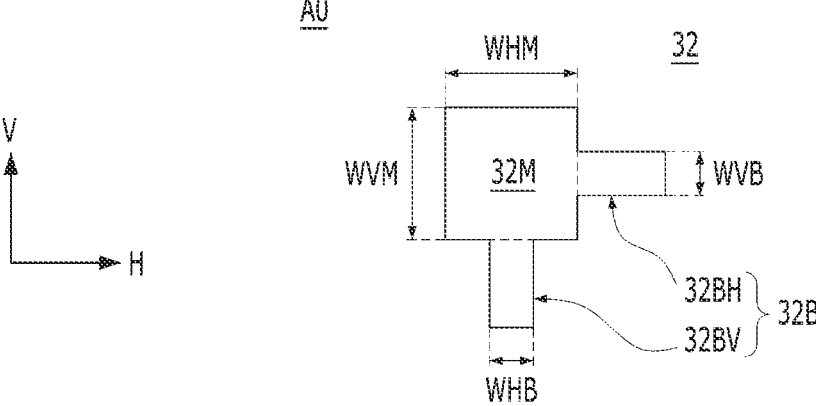
Figure 4B:
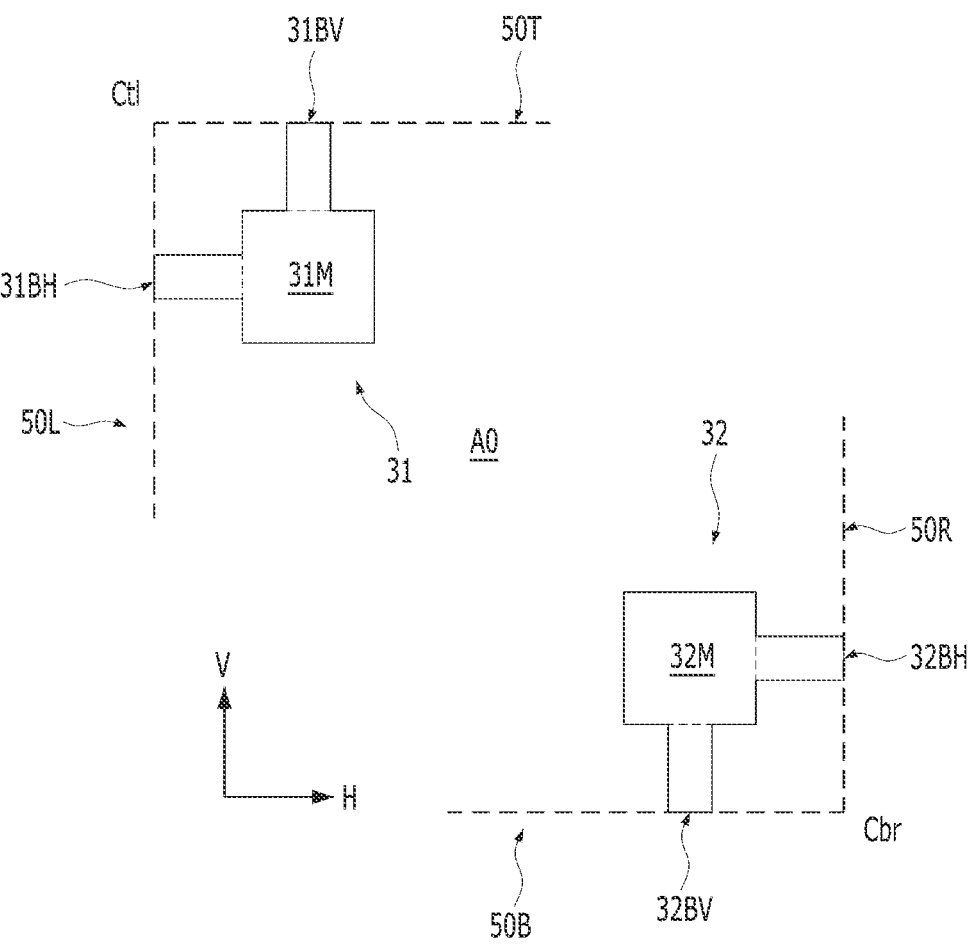
FIG. 4B is a top view illustrating the die stack region and the first and second die position marks which may be overlapping and aligned.

FIG. 4A is an enlarged top view illustrating the first and second die position marks 31 and 32, and FIG. 4B is a top view illustrating the die stack region A0 and the first and second die position marks 31 and 32 overlapping and being aligned.

Referring to FIG. 4A, the first die position mark 31 may include a first main position mark 31M and first branch position marks 31B, and the second die position mark 32 may include a second main position mark 32M and second branch position marks 32B. The first branch position marks 31B may include a first vertical branch position mark 31BV and a first horizontal branch position mark 31BH. The second branch position marks 32B may include a second vertical branch position mark 32BV and a second horizontal branch position mark 32BH. For example, the first die position mark 31 may include the first main position mark 31M having a square shape, the first vertical branch position mark 31BV having a bar shape that abuts a top side of the first main position mark 31M and extends in the vertical direction V, and the first horizontal branch position mark 31BH having a bar shape that abuts a left side of the first main position mark 31M and extends in the horizontal direction H. The second die position mark 32 may include the second main position mark 32M having a square shape, the second vertical branch position mark 32BV having a bar shape that abuts a bottom side of the second main position mark 32M and extends in the vertical direction V, and the second horizontal branch position mark 32BH having a bar shape that abuts a right side of the second main position mark 32M and extends in the horizontal direction H. For example, the first main position mark 31M and the first branch position marks 31BV and 31BH may be integrated in a single body to be materially continued with one another, and the second main position mark 32M and the second branch position marks 32BV and 32BH may be integrated in a single body to be materially continued with one another.

Areas of the first and second main position marks 31M and 32M may be greater than areas of the first and second branch position marks 31B and 32B. In an embodiment, the first main position mark 31M may constitute a first area and the first branch position mark 31B (i.e., the first vertical branch position mark 31BV or the first horizontal branch position mark 31BH) may constitute a second area. In an embodiment, the second area constituting the first branch position mark 31B may be an area of the first horizontal branch position mark 31BH or may be an area of the first vertical branch position mark 31BV. In an embodiment, the first area constituting the first main position mark 31M may be greater than the second area constituting the first branch position mark 31B (i.e., first vertical branch position mark 31BV or first horizontal branch position mark 31BH). For example, the first area constituting the first main position mark 31M may be greater than the second area constituting the first horizontal branch position mark 31BH. For example, the first area constituting the first main position mark 31M may be greater than the second area constituting the first vertical branch position mark 31BV. In an embodiment, the second main position mark 32M may constitute a third area and the second branch position mark 32B (i.e., the second vertical branch position mark 32BV or the second horizontal branch position mark 32BH) may constitute a fourth area. In an embodiment, the fourth area constituting the second branch position mark 32B may be an area of the second horizontal branch position mark 32BH or may be an area of the second vertical branch position mark 32BV. In an embodiment, the third area constituting the second main position mark 32M may be greater than the fourth area constituting the second branch position mark 32B (i.e., the second vertical branch position mark 32BV or the second horizontal branch position mark 32BH). For example, the third area constituting the second main position mark 32M may be greater than the fourth area constituting the second horizontal branch position mark 32BH. For example, the third area constituting the second main position mark 32M may be greater than the fourth area constituting the second vertical branch position mark 32BV. For example, a width WHM of the first and second main position marks 31M and 32M in the horizontal direction H may be greater than a widths WHB of the first and second vertical branch position marks 31BV and 32BV in the horizontal direction H. Also, a width WVM of the first and second main position marks 31M and 32M in the vertical direction V may be greater than a widths WVB of the first and second horizontal branch position marks 31BH and 32BH in the vertical direction V.

Referring to FIG. 4B, the first and second die position marks 31 and 32 may be disposed to completely position in the die stack region A0. For example, the first die position mark 31 may be positioned to abut or overlap with the top-left corner Ctl of the die stack region A0, and the second die position mark 32 may be positioned to abut or overlap with the bottom-right corner Cbr of the die stack region A0. The first and second main position marks 31M and 32M may be spaced apart from the respective sides 50T, 50B, 50L, and 50R of the die stack region A0. The top end of the first vertical branch position mark 31BV of the first die position mark 31 may be positioned to abut the top side 50T of the die stack region A0. The left end of the first horizontal branch position mark 31BH of the first die position mark 31 may be positioned to abut the left side 50L of the die stack region A0. The bottom end of the second vertical branch position mark 32BV of the second die position mark 32 may be positioned to abut the bottom side 50B of the die stack region A0. The right end of the second horizontal branch position mark 32BH of the second die position mark 32 may be positioned to abut the right side 50R of the die stack region A0.

Figure 5:
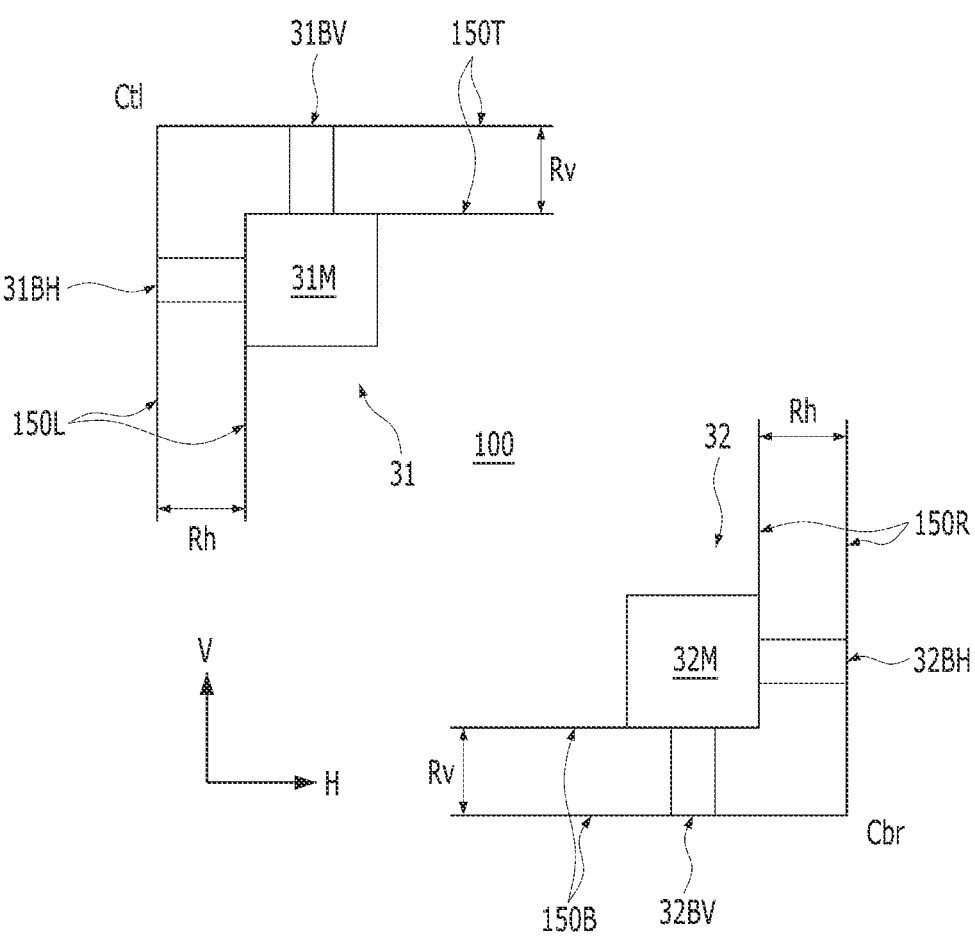
FIG. 5 is a top view illustrating a condition for determining a semiconductor die mounted on a substrate to be a spec-in stack.

FIG. 5 is a top view illustrating a condition for determining a semiconductor die 100 mounted on the substrate 10 to be a spec-in stack.

Referring to FIG. 5, when the four sides 150T, 150B, 150L, and 150R of the semiconductor die 100 which is mounted on the substrate 10 are positioned within spec-in ranges Rv and Rh, it may be determined that the semiconductor die 100 is properly mounted on the substrate 10. The spec-in ranges Rv and Rh may include a vertical spec-in range Rv and a horizontal spec-in range Rh. The vertical spec-in range Rv may be the same as the length of the first and second vertical branch position marks 31BV and 32BV in the vertical direction V. The horizontal spec-in range Rh may be equal to the length of the first and second horizontal branch position marks 31BH and 32BH in the horizontal direction H. For example, in the top view, when the top side 150T and the bottom side 150B of the mounted semiconductor die 100 are positioned within the vertical spec-in range Rv and the left side 150L and the right side 150R of the mounted semiconductor die 100 are positioned within the low spec-in range Rh, it may be determined that the semiconductor die 100 is mounted on the substrate 10 in a spec-in state. In other words, when the first and second vertical branch position marks 31BV and 32BV and the first and second horizontal branch position marks 31BH and 32BH are partially exposed out of the four sides 150T, 150B, 150L, and 150R of the mounted semiconductor die 100, it may also be determined to be in the spec-in state.

Figure 6A:
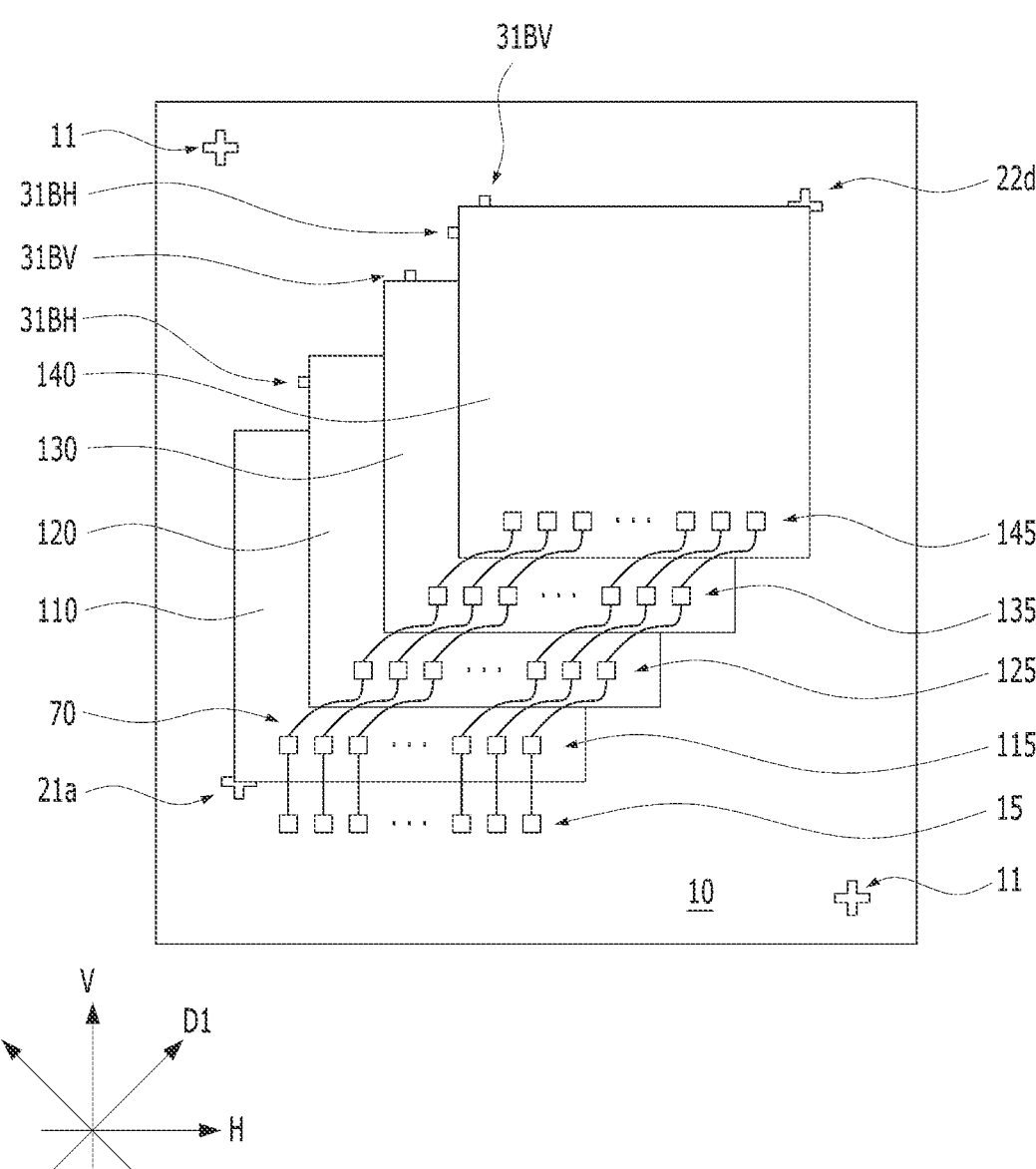
FIGS. 6A, 6B, and 6C are top views of semiconductor die stack structures showing various cases in which the stack state of semiconductor dies mounted on a substrate is determined to be a spec-in stack.
Figure 6B:
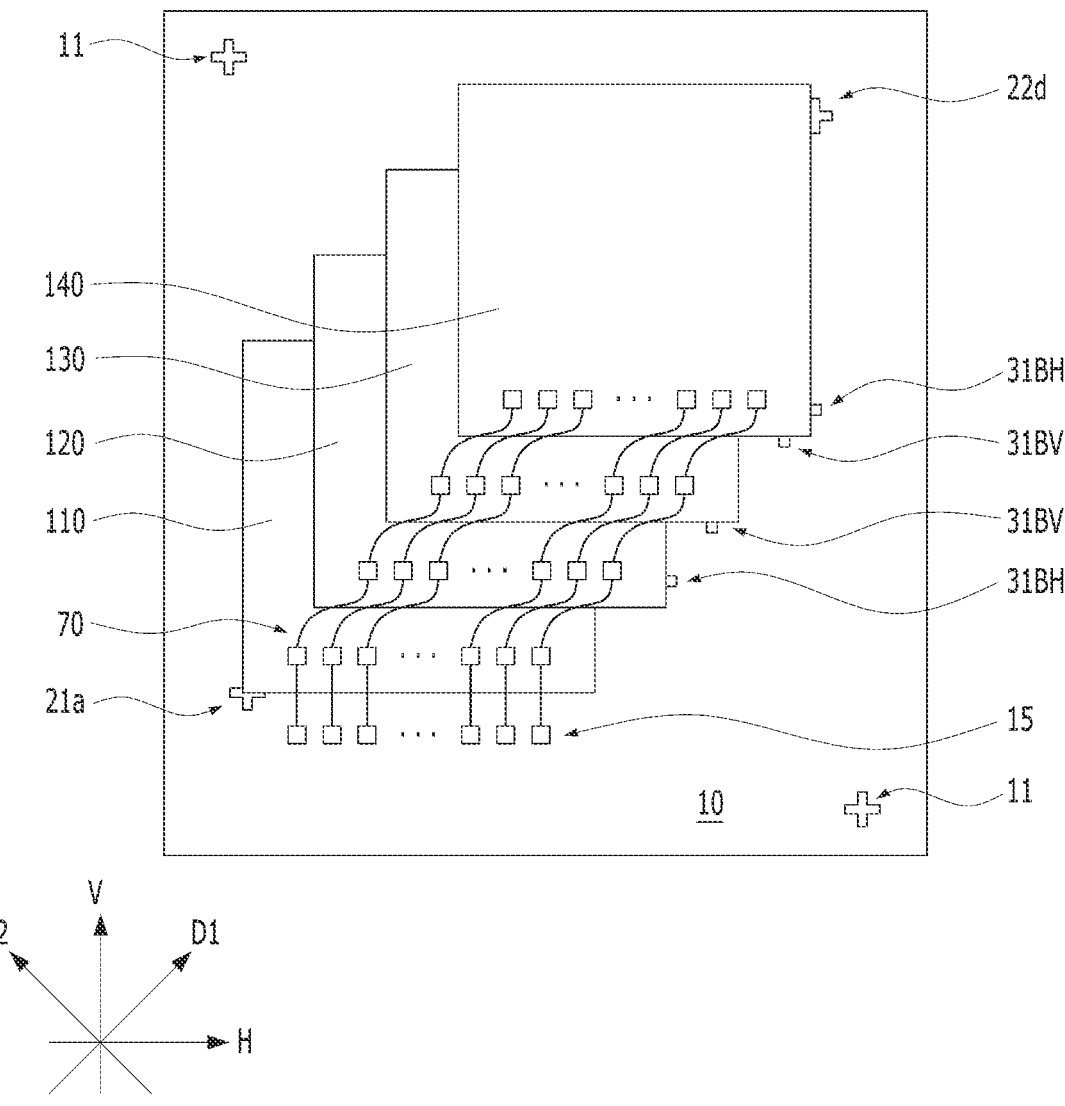
Figure 6C:
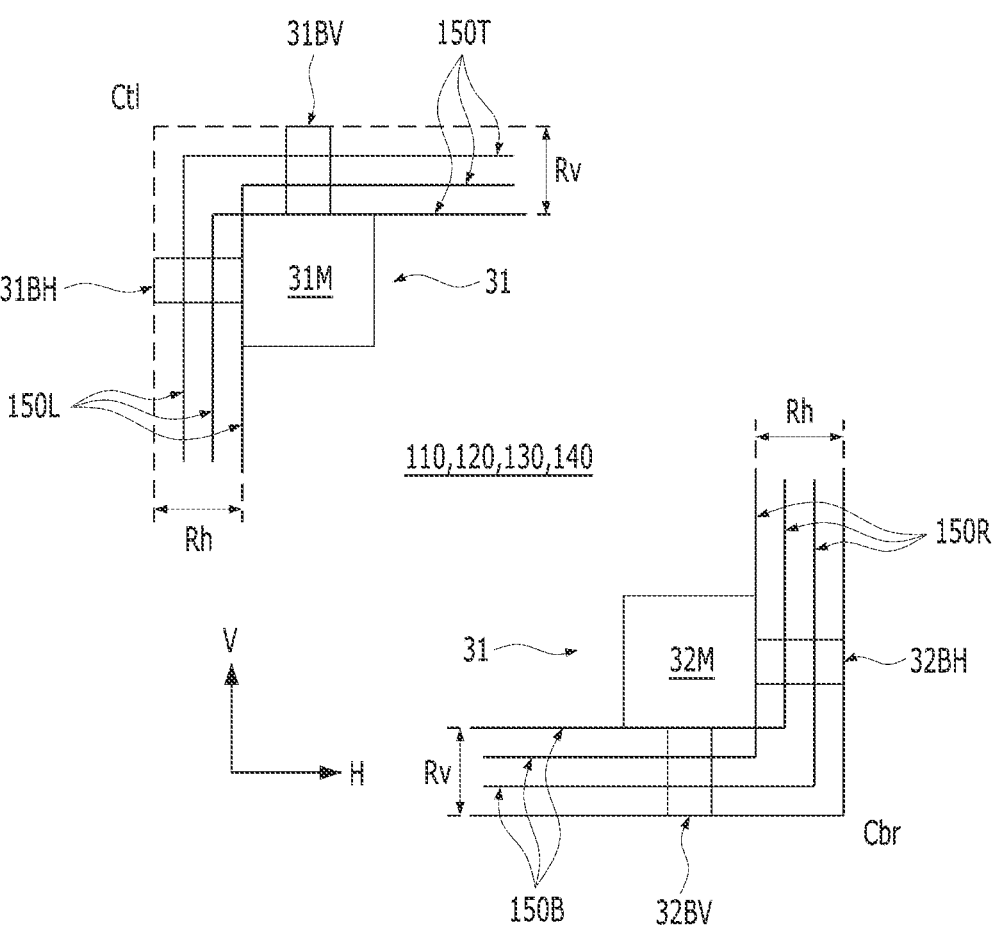

FIGS. 6A to 6C are top views of semiconductor die stack structures showing various cases in which the stack state of semiconductor dies 110 to 140 mounted on the substrate 10 is determined to be a spec-in stack. Referring to FIGS. 6A to 6C, when all the four sides 150T, 150B, 150L, and 150R of each of the semiconductor dies 110 to 140 mounted on the substrate 10 are positioned within the spec-in ranges Rv and Rh, the stack state of the semiconductor dies 110 to 140 may be determined to be a spec-in stack. Referring to back FIG. 5, in the spec-in stack, the first and second main position marks 31M and 32M might not be exposed, and the first and second branch position marks 31BV, 31BH, 32BV and 32BH might not be exposed or may be exposed partially.

Die pads 115 to 145 may be arranged adjacent to the edge of each of the semiconductor dies 110 to 140, and each of the die pads 115 to 145 may be electrically connected to the substrate pads 15 through wires 70.

Figure 7A:
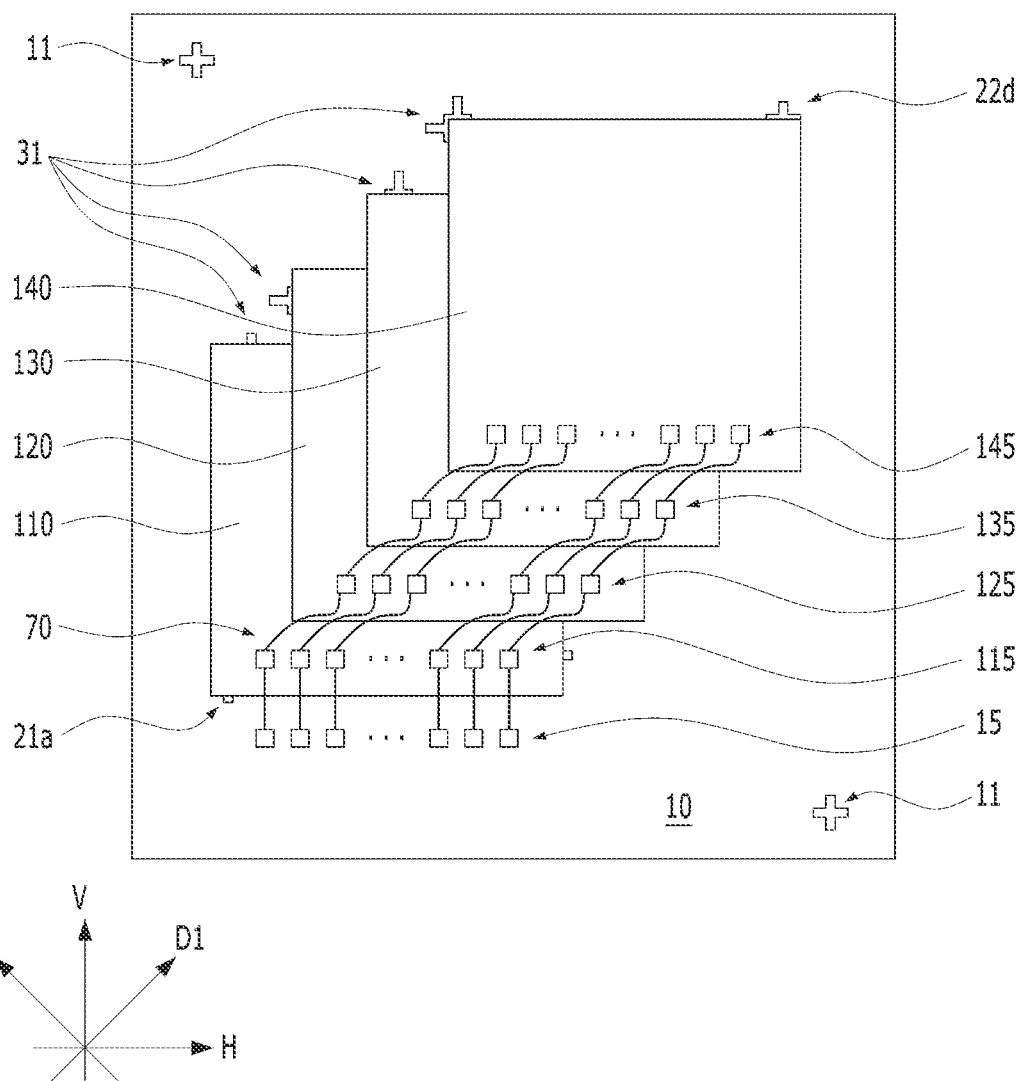
FIGS. 7A, 7B, and 7C are top views of semiconductor die stack structures showing various cases in which the stack state of semiconductor dies mounted on a substrate is determined to be a spec-out stack.
Figure 7B:
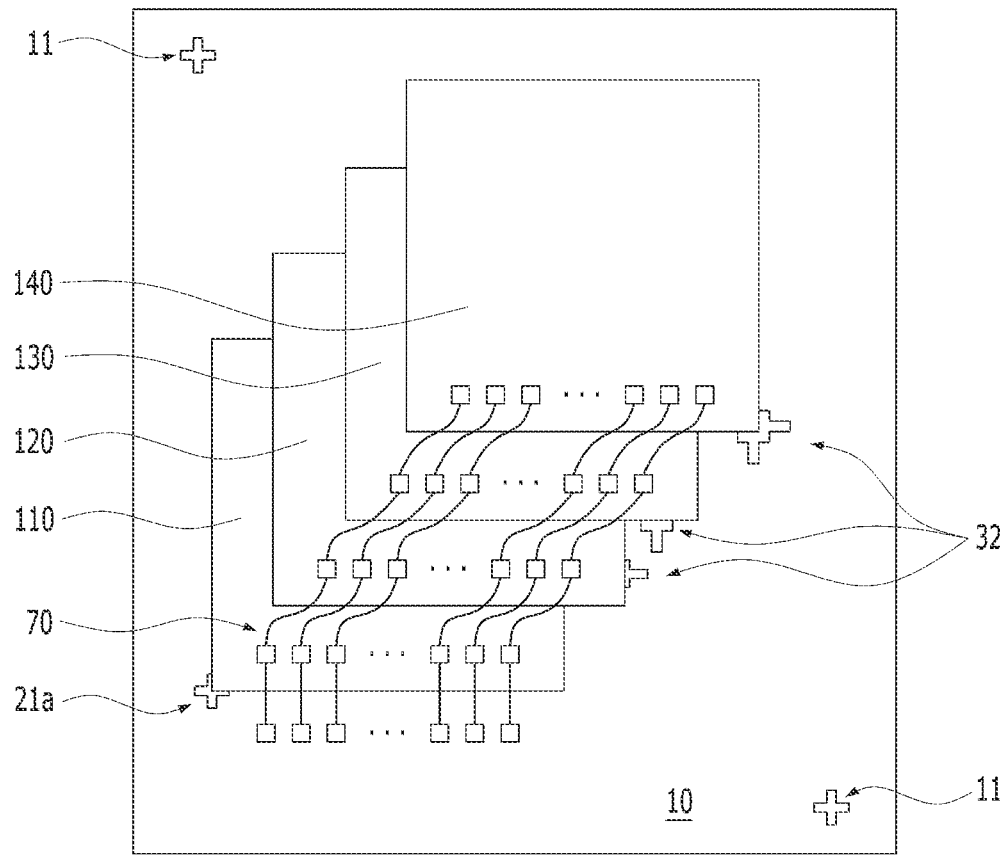
Figure 7B:
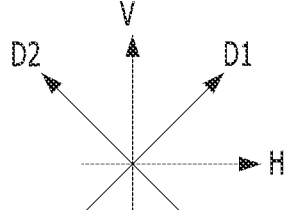
Figure 7C:
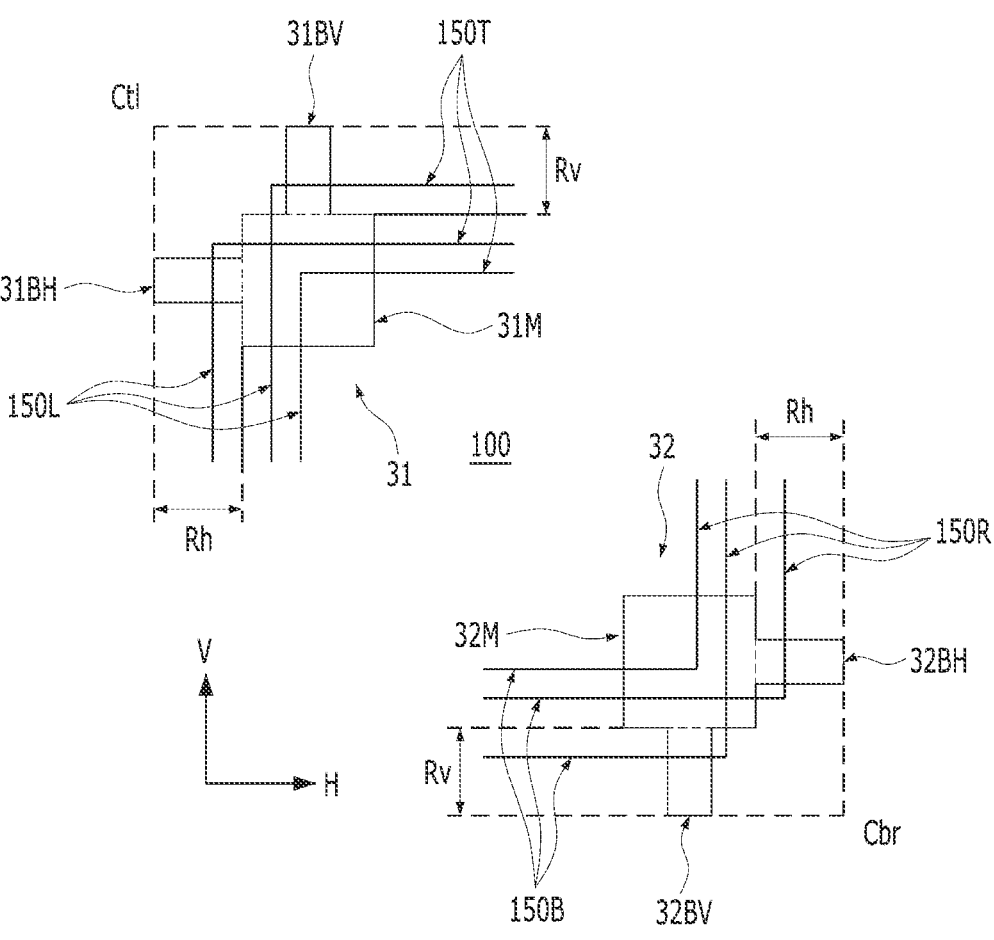

FIGS. 7A to 7C are top views of semiconductor die stack structures showing various cases in which the stack state of semiconductor dies 110 to 140 mounted on the substrate 10 is determined to be a spec-out stack. Referring to FIGS. 7A to 7C, when at least one among the four sides 150T, 150B, 150L, and 150R of each of the semiconductor dies 110 to 140 mounted on the substrate 10 is not in the spec-in ranges Rv and Rh, the mounting state of the semiconductor dies 110 to 140 may be determined to be a spec-out stack. Referring to FIG. 7A, for example, the first semiconductor die 110 is a spec-out offset stacked in a reverse direction of a first diagonal direction D1, the second semiconductor die 120 is spec-out offset stacked in the horizontal direction H, the third semiconductor die 130 is spec-out offset stacked in a reverse direction of the vertical direction V, and the fourth semiconductor die 140 is spec-out offset stacked in a reverse direction of the second diagonal direction D2. Referring to FIG. 7B, the first semiconductor die 110 is spec-in stacked in good-alignment, the second semiconductor die 120 is spec-out offset stacked in a reverse direction of the horizontal direction H, the third semiconductor die 130 is spec-out offset stacked in the first diagonal direction D1, and the fourth semiconductor die 140 is spec-out offset stacked in the second diagonal direction D2. In other words, referring back to FIG. 5, some of the first and second main position marks 31M and 32M may be exposed in the spec-out stack. Referring to FIG. 7C, it may be seen that at least one among the four sides 150T, 150B, 150L, and 150R of the semiconductor die 100 may be positioned to expose at least a portion of the first and second main position marks 31M and 32M in the spec-out stack state.

For an embodiment, it may be very difficult to determine the stack state of the semiconductor dies 110 to 140 based on the first and second die alignment marks 21 (i.e., 21a to 21d) and 22 (i.e., 22a to 22d). Since, in an embodiment, the difference in light reflected from the first and second die alignment marks 21 and 22 is slight according to the stack state of the semiconductor dies 110 to 140, it may be difficult to determine the stack state of the semiconductor dies 110 to 140.

According to the stack state of the semiconductor dies 110 to 140, that is, according to how the first and second main position marks 31M and 32M are exposed, the difference in the intensity of the light reflected by the first and second die position marks 31 and 32 may be changed abruptly. Therefore, in an embodiment, the stack state of the semiconductor dies 110 to 140 may be determined more readily based on the first and second die position marks 31 and 32 as compared to other position marks.

Figure 8:
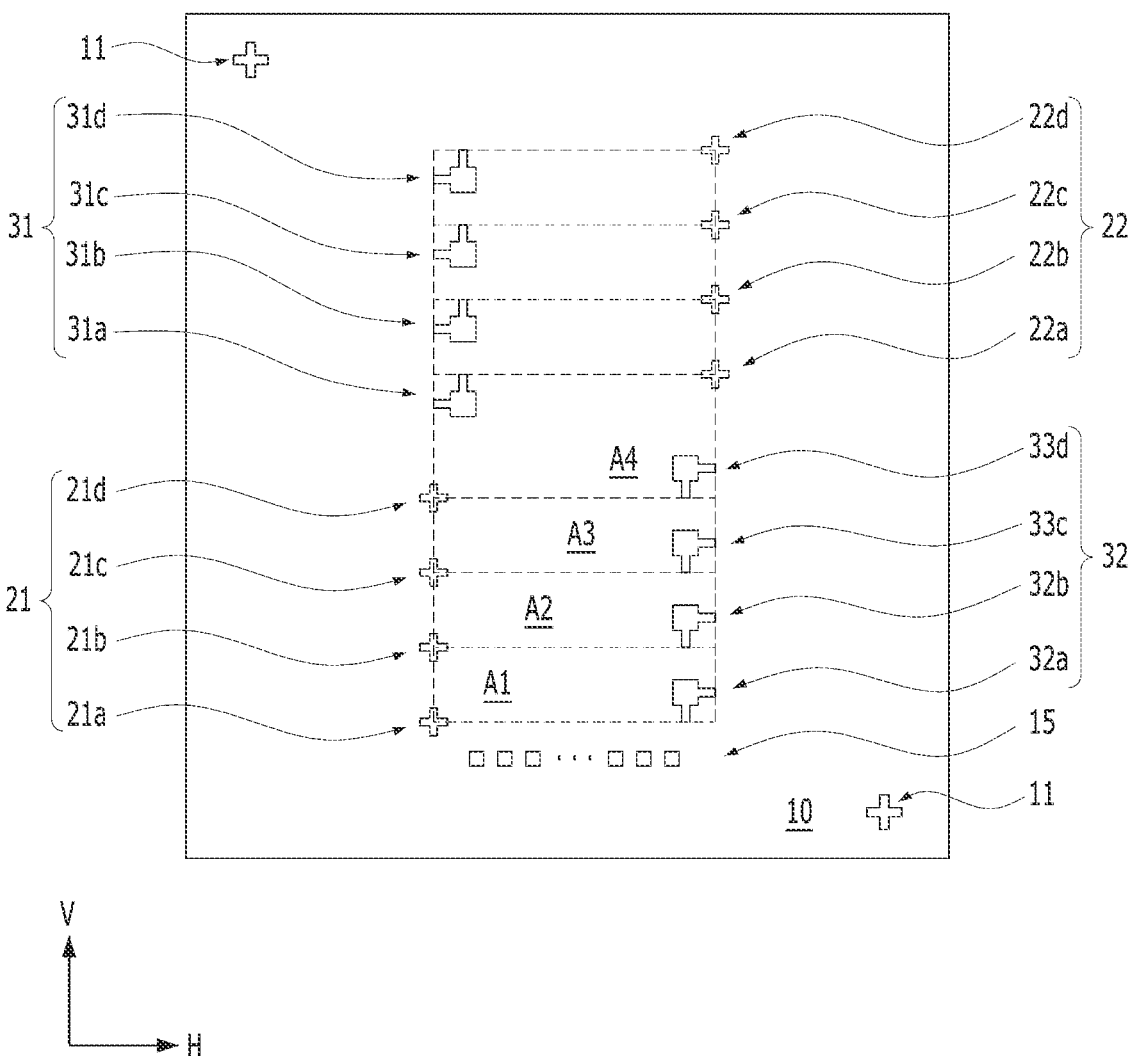
FIG. 8 is a top view of a substrate in accordance with another embodiment of the present disclosure.

FIG. 8 is a top view of the substrate 10 in accordance with an embodiment of the present disclosure. Referring to FIG. 8, the substrate 10 according to an embodiment of the present disclosure may include substrate alignment marks 11 positioned on the surface of the substrate 10, and the first die alignment marks 21, the second die alignment marks 22, the first die position marks 31, and the second die position marks 32 that are respectively positioned in the die stack regions A1 to A4 of the substrate 10. The first die alignment marks 21, the second die alignment marks 22, the first die position marks 31, and the second die position marks 32 may be arranged in the vertical direction V. Accordingly, the die stack regions A1 to A4 may also be arranged to be offset in the vertical direction V.

Figure 9A:
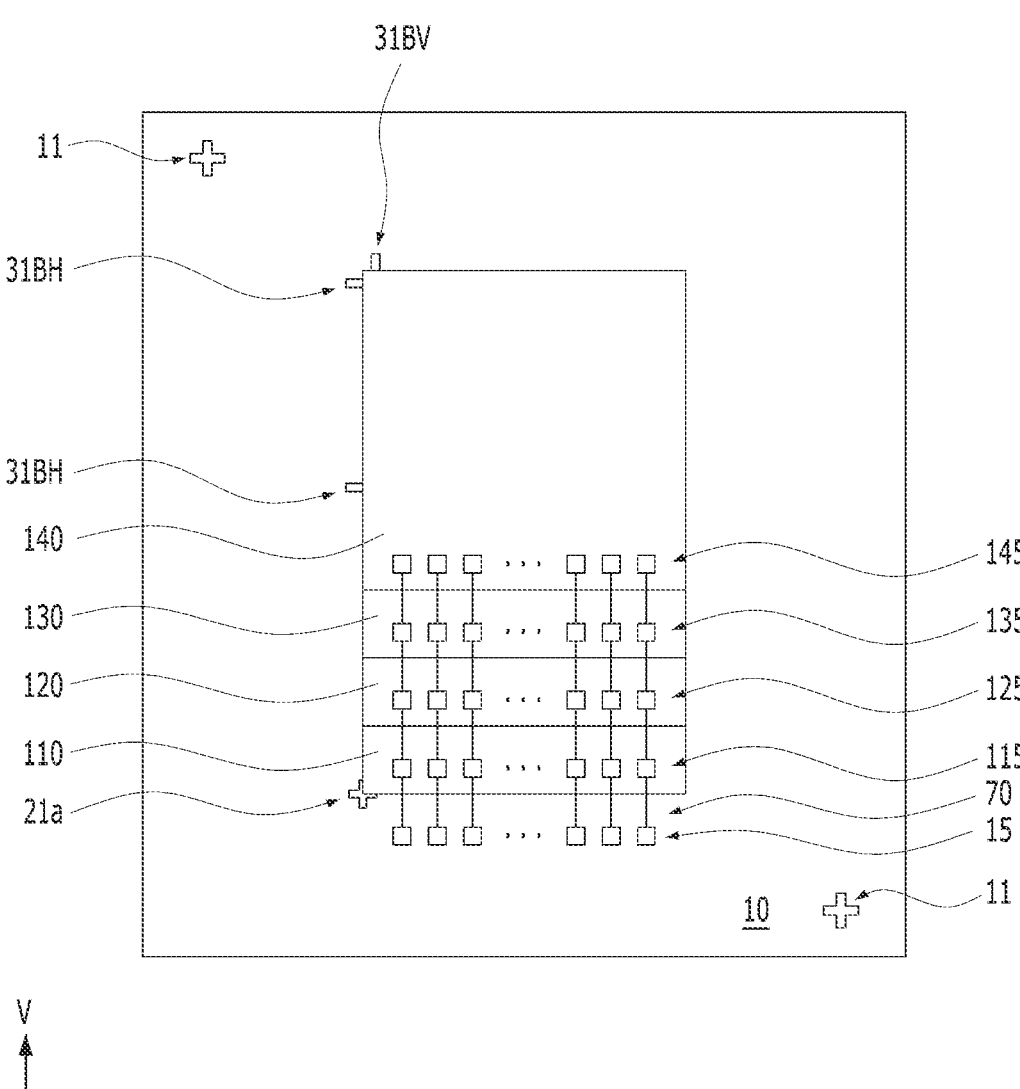
FIG. 9A shows cases in which the stack state of the semiconductor dies mounted on a substrate is determined to be a spec-in stack.

FIG. 9A shows cases in which the stack state of the semiconductor dies 110 to 140 mounted on the substrate 10 is determined to be a spec-in stack. With further reference to FIGS. 6A to 6C, when all the four sides 150T, 150B, 150L, and 150R of each of the semiconductor dies 110 to 140 mounted on the substrate 10 are within the spec-in ranges Rv and Rh, the stack state of the semiconductor dies 110 to 140 may be determined to be a spec-in stack. As described above, in the spec-in stack, the first and second main position marks 31M, 32M might not be exposed, and the first and second branch position marks 31B and 32B might not be exposed or may be exposed partially.

Figure 9B:
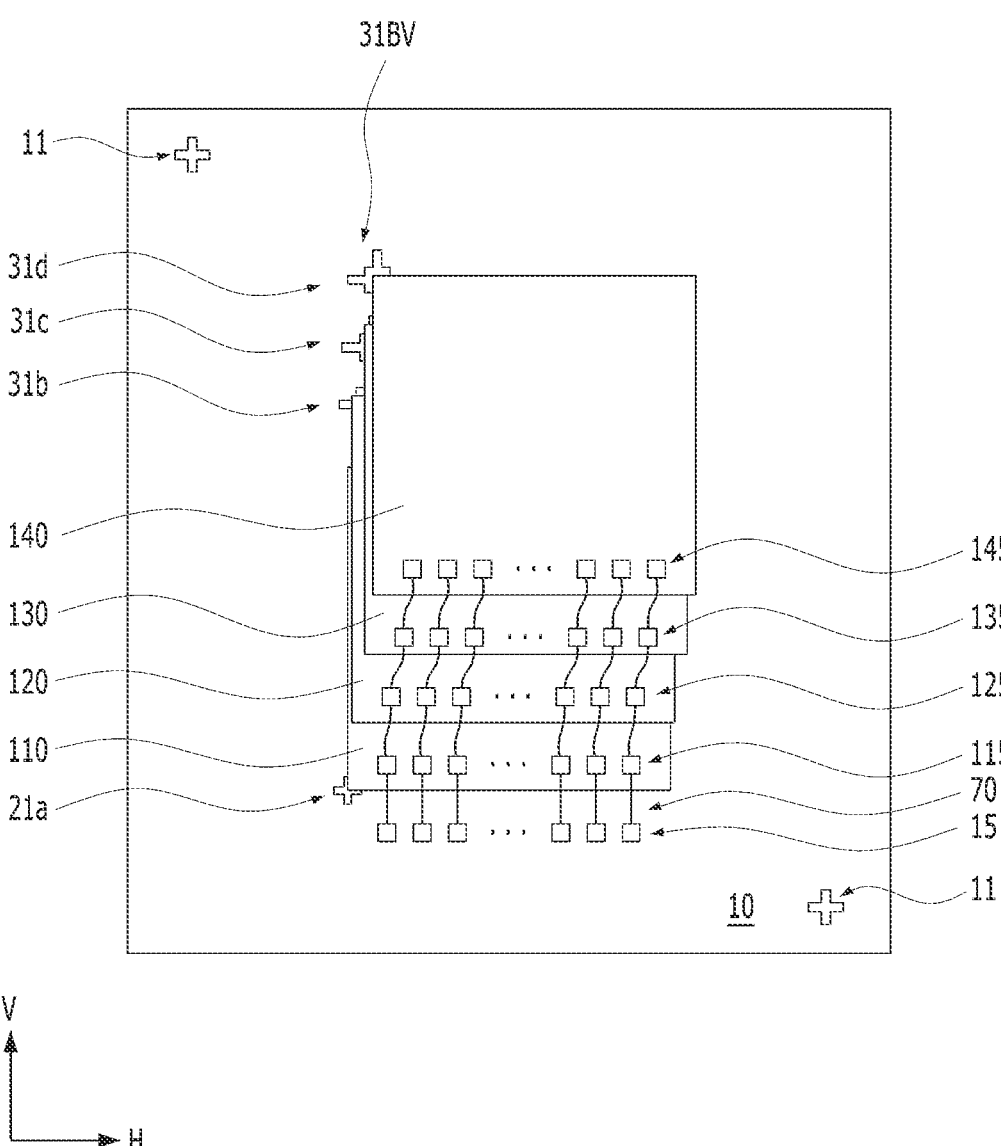
FIG. 9B shows cases in which the stack state of semiconductor dies mounted on a substrate is determined to be a spec-out stack.

FIG. 9B shows cases in which the stack state of semiconductor dies 110 to 140 mounted on the substrate 10 is determined to be a spec-out stack. With further reference to FIGS. 7A to 7C, when at least one among the four sides 150T, 150B, 150L, and 150R of each of the semiconductor dies 110 to 140 mounted on the substrate 10 is not in the spec-in ranges Rv and Rh, the mounting state of the semiconductor dies 110 to 140 may be determined to be a spec-out stack. As described above, in the spec-out stack, some of the first and second main position marks 31M and 32M may be exposed.

According to various embodiments of the present disclosure, it may be possible to more readily determine spec-in/spec-out of a stacked state of a semiconductor die.

According to various embodiments of the present disclosure, in the semiconductor die stacking process, a semiconductor die may be stacked in a spec-in state in real time.

While the present disclosure has been described with respect to the specific embodiments, it will be apparent to those skilled in the art that various changes and modifications may be made without departing from the spirit and scope of the embodiments as defined in the following claims.

What is claimed is:

1. A substrate, comprising:
a first substrate alignment mark positioned at a surface of the substrate adjacent to a first corner of the substrate;
a second substrate alignment mark positioned at the surface of the substrate adjacent to a second corner of the substrate;
a plurality of first die alignment marks and a plurality of first die position marks defining a plurality of die stack regions, wherein the plurality of die stack regions have a same area;
wherein each of the first die alignment marks has substantially a cross shape having substantially a vertical bar and substantially a horizontal bar intersecting each other substantially perpendicularly,
wherein each of the first die position marks includes:
a first main position mark comprising a first area; and
a first branch position mark comprising a second area, and
wherein the first area is different from the second area.

2. The substrate of claim 1, wherein each of the first die alignment marks is positioned to be aligned with a first corner of each of the die stack regions.

3. The substrate of claim 2, further comprising:
a plurality of second die alignment marks,
wherein each of the second die alignment marks is positioned at a second corner of each of the die stack regions, the second corner located opposite to the first corner of each of the die stack regions in a first diagonal direction.

4. The substrate of claim 3, wherein each of the first die position marks is positioned at a third corner of each of the die stack regions, and the third corner is aligned in a horizontal direction with the first corner and aligned in a vertical direction with the second corner, and
the horizontal direction and the vertical direction are substantially perpendicular to each other.

5. The substrate of claim 4, further comprising:
a plurality of second die position marks,
wherein each of the second die position marks is positioned at a fourth corner of each of the die stack regions which is opposite to the third corner in a second diagonal direction that intersects the first diagonal direction.

6. The substrate of claim 1, wherein each of the first branch position marks includes:
a first vertical branch position mark having substantially a vertical bar shape that abuts a first side of the first main position mark and extends in substantially a vertical direction; and
a first horizontal branch position mark having substantially a horizontal bar shape that abuts a second side of the first main position mark and extends in substantially a horizontal direction.

7. The substrate of claim 6, further comprising:
a plurality of second die position marks each disposed to be aligned adjacent to a corner which is opposite to each of the first die position marks in a diagonal direction.

8. The substrate of claim 7, wherein each of the second die position marks includes:
a second main position mark comprising a third area, and
a second branch position mark comprising a fourth area, and
wherein the third area is greater than the second area.

9. The substrate of claim 8, wherein the second branch position mark includes:
a second vertical branch position mark having substantially a vertical bar shape that abuts a first side of the second main position mark and extends in substantially the vertical direction; and
a second horizontal branch position mark having substantially a horizontal bar shape that abuts a second side of the second main position mark and extends in substantially the horizontal direction.

10. The substrate of claim 1,
wherein the plurality of die stack regions, the plurality of first die alignment marks, and the plurality of first die position marks are arranged to be offset in a horizontal direction and a vertical direction, respectively.

11. A substrate, comprising:
a first substrate alignment mark positioned at a surface of the substrate adjacent to a first corner of the substrate;
a second substrate alignment mark positioned at the surface of the substrate adjacent to a second corner of the substrate;
a plurality of die stack regions, wherein the plurality of die stack regions have a same area;
a plurality of first die alignment marks each positioned at a bottom left corner of each of the die stack regions;
a plurality of second die alignment marks each positioned at a top right corner of each of the die stack regions; and
a plurality of first die position marks each positioned at a top left corner of each of the die stack regions,
wherein each of the first die alignment marks and each of the second die alignment marks substantially have a cross shape having a vertical bar and a horizontal bar that substantially perpendicularly intersect each other, and each of the first die position marks includes:

a first main position mark having substantially a square shape, the first main position mark comprising a first area; and a first branch position mark having substantially a bar shape, the first branch position mark comprising a second area less than the first area.

12. The substrate of claim 11, wherein the first branch position mark includes:

a first vertical branch position mark having a substantially vertical bar shape that abuts a top side or a bottom side of the first main position mark and extends in substantially a vertical direction; and a first horizontal branch position mark having substantially a horizontal bar shape that abuts a left side or a right side of the first main position mark and extends in substantially a horizontal direction.

13. The substrate of claim 11, further comprising:

a plurality of second die position marks each positioned at a bottom right corner of each of the die stack regions, wherein each of the second die position marks includes:

a second main position mark having substantially a square shape, the second main position mark comprising a third area, and a second branch position mark having substantially a bar shape, the second branch position mark comprising a fourth area less than the third area, and the second branch position mark includes:

a second vertical branch position mark having substantially a vertical bar shape that abuts a top side or a bottom side of the second main position mark and extends in substantially the vertical direction; and a second horizontal branch position mark having substantially a horizontal bar shape that abuts a left side or a right side of the second main position mark and extends in substantially the horizontal direction.

14. The substrate of claim 11, wherein the plurality of die stack regions, the plurality of first die alignment marks, and the plurality of first die position marks are arranged to be offset in a horizontal direction and a vertical direction, respectively.

15. A semiconductor die stack structure, comprising:

a plurality of semiconductor dies stacked over a substrate, wherein the plurality of semiconductor dies have a same specification, wherein each of the semiconductor dies has first to fourth corners, and the first corner and the second corner are opposite to each other in a first diagonal direction, and the third corner and the fourth corner are opposite to each other in a second diagonal direction, and the first diagonal direction and the second diagonal direction intersect each other;

a plurality of first die alignment marks each positioned over the substrate to be aligned with the first corner of each of the semiconductor die; and a plurality of first die position marks each positioned over the substrate to be aligned with the third corner of each of the semiconductor die, wherein each of the first die alignment marks has substantially a cross shape having substantially a bar-shaped vertical bar extending in substantially a vertical direction and substantially a bar-shaped horizontal bar extending in substantially a horizontal direction which is substantially perpendicular to the vertical direction, and each of the first die position marks includes:

a first main position mark having substantially a square shape and a first branch position mark having substantially a bar shape.

16. The semiconductor die stack structure of claim 15, further comprising:

a plurality of second die alignment marks each positioned over the substrate to be aligned with the second corner of each of the semiconductor dies, wherein each of the second die alignment marks is substantially a cross shape having substantially a vertical bar and a horizontal bar.

17. The semiconductor die stack structure of claim 15, wherein the first branch position mark includes:

a first vertical branch position mark of substantially a vertical bar shape that abuts a first side of the first main position mark and extends in substantially the vertical direction; and a first horizontal branch position mark of substantially a horizontal bar shape that abuts a second side of the first main position mark and extends in substantially the horizontal direction.

18. The semiconductor die stack structure of claim 17, further comprising:

a plurality of second die position marks each positioned over the substrate to be aligned with the fourth corner of each of the semiconductor dies, wherein each of the second die position marks includes:

a first main position mark having substantially a square shape; and a second branch position mark having substantially a bar shape.

19. The semiconductor die stack structure of claim 18, wherein the second branch position mark includes:

a second vertical branch position mark of substantially a vertical bar shape that abuts a first side of the second main position mark and extends in substantially the vertical direction; and a second horizontal branch position mark of substantially a horizontal bar shape that abuts a second side of the second main position mark and extends in substantially the horizontal direction.

20. The substrate of claim 15, wherein the substrate includes:

a first substrate alignment mark positioned at a surface of the substrate adjacent to a first corner of the substrate; and a second substrate alignment mark positioned at the surface of the substrate adjacent to a second corner of the substrate, wherein the plurality of semiconductor die are offset stacked in a horizontal direction and a vertical direction, and wherein the plurality of first die alignment marks, and the plurality of first die position marks are arranged to be offset in the horizontal direction and the vertical direction, respectively.

* * * * *